United States Patent [19]
Do et al.

[11] Patent Number: 6,124,140
[45] Date of Patent: Sep. 26, 2000

[54] METHOD FOR MEASURING FEATURES OF A SEMICONDUCTOR DEVICE

[75] Inventors: Douglas D. Do; Jeff C. Johnson, both of Boise, Id.

[73] Assignee: Micron Technology, Inc., Boise, Id.

[21] Appl. No.: 09/083,835

[22] Filed: May 22, 1998

[51] Int. Cl.⁷ .................................................. H01L 21/00
[52] U.S. Cl. ................................................................ 438/10
[58] Field of Search .................................. 438/10, 11–13, 438/7, 800, 401, 462

[56] References Cited

U.S. PATENT DOCUMENTS 5,512,746  4/1996  Saito ...................................... 250/310

FOREIGN PATENT DOCUMENTS 3066488  3/1991  Japan .

OTHER PUBLICATIONS

Fuse et al., "Focusing Optical System for Dual–Beam Laser Cutting and Welding," *Sumitomo Electric Technical Review*, 42: 87–93, 1996 (abstract only).

"The S–8000 Series CD–Measurement SEM and Applications," *Hitachi Scientific Instrument Technical Data—SEM*, No. 67, front cover, p. 2, back cover, 1995.

*Primary Examiner*—Charles Bowers
*Assistant Examiner*—Craig Thompson
*Attorney, Agent, or Firm*—Dorsey & Whitney LLP

[57] ABSTRACT

A method and apparatus for measuring the dimensions of features on the surface of a semiconductor device. The method may include passing a first electron beam having a first depth of focus over the semiconductor device and passing a second electron beam having a second depth of focus over the device. Electrical signals generated by the two electron beams may be analyzed singly or in combination to determine the lateral or vertical dimensions of the features at one or more positions relative to the surface of the semiconductor device. In one embodiment, the first and second electron beams are generated sequentially from a single electron gun. In another embodiment, the first and second electron beams are generated sequentially or simultaneously by either two separate electron guns or a single electron gun positioned proximate to two separate electron beam ports.

55 Claims, 6 Drawing Sheets

DISTANCE IN X DIRECTION

METHOD FOR MEASURING FEATURES OF A SEMICONDUCTOR DEVICE

TECHNICAL FIELD

The present invention relates to methods and devices for measuring the dimensions of features of semiconductor devices.

BACKGROUND OF THE INVENTION

Semiconductor devices typically include a wafer comprising silicon or another semiconductor material that is etched or otherwise processed to form circuit elements. The wafer typically includes surface features, such as electrical contacts or other components, that either project upward from the surface of the wafer or form depressions or concavities in the surface of the wafer. Once the wafer has been processed, it may be desirable to examine the features under a microscope and measure the dimensions of the features to ensure that they conform to design specifications. Because the features are typically too small to resolve with visible light, which has a relatively large wavelength, the wafers are typically examined with short-wavelength electron beams under a scanning electron microscope (SEM).

One conventional method for analyzing a semiconductor wafer with a SEM includes scanning the wafer with an electron beam that is either reflected by the features, or causes the features to emit secondary electrons. The reflected or emitted electrons are received by a detector that generates a voltage signal corresponding to the rate at which the electrons are received. The voltage signal changes as a function of the orientation of the features and may be used to create an image having contrasting light and dark regions, similar in appearance to a conventional photograph. The distances between the light and dark regions may then be measured to determine the dimensions of the features.

Where the features of the semiconductor wafer are spaced relatively far apart, the electron beam may be relatively wide and may have a relatively large depth of focus, so that the electron beam may resolve features having a wide range of heights or depths relative to the surface of the wafer. As electronic devices are made smaller and smaller, the spacing between the features on the surface of the wafer becomes smaller and smaller, and the aspect ratio of the spaces between the features increases. To adequately resolve the closely-spaced features, it has become necessary to reduce the width of the electron beam.

One drawback with conventional electron beam techniques is that, when the width of the electron beam is reduced, the depth of focus of the beam is also reduced. Accordingly, the electron beam may not be accurately focused on any relevant portion of the feature, or may be accurately focused on only one relevant portion of the feature. For example, where the beam is not accurately focused on the edges of the feature, it may be difficult to locate the edges of the feature, and may accordingly be difficult to determine the dimensions of the feature. Where the electron beam is focused on only one portion of the feature, only that portion may be accurately measured. For example, where the feature is tapered and the dimensions of the feature vary with distance from the surface of the wafer, the dimensions may only be accurately measured at the portion of the feature near the focal point of the electron beam.

Electron beams in a SEM may be automatically focused using split beam techniques or other procedures. However, a drawback with conventional SEM automatic focusing methods is that, upon reviewing the image created by the SEM, it may not be clear which portion of the feature is in focus. If the dimensions of the feature change as a function of distance from the surface of the wafer (e.g., if the feature is tapered), it may be difficult to determine which portion of the feature the resulting measurement corresponds to. The resulting measurements may therefore be inaccurate.

SUMMARY OF THE INVENTION

The present invention is directed toward a method and apparatus for measuring the dimensions of semiconductor substrate features. The apparatus may include at least one source of electrons positioned above a stage that supports the semiconductor device. The apparatus may further include a port surface having two ports positioned between the electron source and the support to generate two electron beams. Alternatively, the apparatus may include two electron sources to generate two electron beams. The electron beams pass through the ports and through focusing devices that may focus one electron beam on a first position relative to the semiconductor device and may focus the other electron beam at a second position relative to the semiconductor device. The support may be moved relative to the electron beams to scan the electron beams across the semiconductor device. Electrons that are either reflected or emitted by the semiconductor device when the electron beams impinge thereon may be received by detectors positioned above the semiconductor device. The detector may generate signals corresponding to the intensity of the flow of electrons it receives, and the signals may be used to generate a representation corresponding to the edges of the semiconductor device features. For example, the representation may include a graphical image or a table indicating the intensity of the reflected or emitted beams as a function of the distance traversed by the incident beam across the semiconductor device.

Alternatively, an electron beam having a first depth of focus may be scanned over the semiconductor device to create a first reflected or emitted beam. The electron beam may be re-focused to have a second depth of focus and a second reflected or emitted beam may be generated by scanning the electron beam at the second depth of focus over the semiconductor device. A user may measure the lateral dimensions of the features of the semiconductor device by analyzing, either separately or together, a graphical or tabular representation of the reflected or emitted beams.

The user may alternatively measure a height or a depth of the semiconductor device feature by analyzing signals reflected by or emitted from the device when an electron beam having a first depth of focus is focused on one portion of the feature and an electron beam having a second depth of focus is focused on another portion of the feature. The height or depth of the feature may be correlated with the difference between the two depths of focus.

DETAILED DESCRIPTION OF THE INVENTION

The present invention is directed toward methods and apparatuses for measuring the dimensions of features of a semiconductor device. The method may include scanning the semiconductor device with an electron beam focused first at one depth and then at a second depth, or may include scanning the semiconductor device with two separate electron beams, each focused at a different depth. Many specific details of certain embodiments of the invention are set forth in the following description and in FIGS. 1–6 to provide a thorough understanding of such embodiments. One skilled in the art, however, will understand that the present invention may have additional embodiments and that they may be practiced without several of the details described in the following description.

Figure 1:
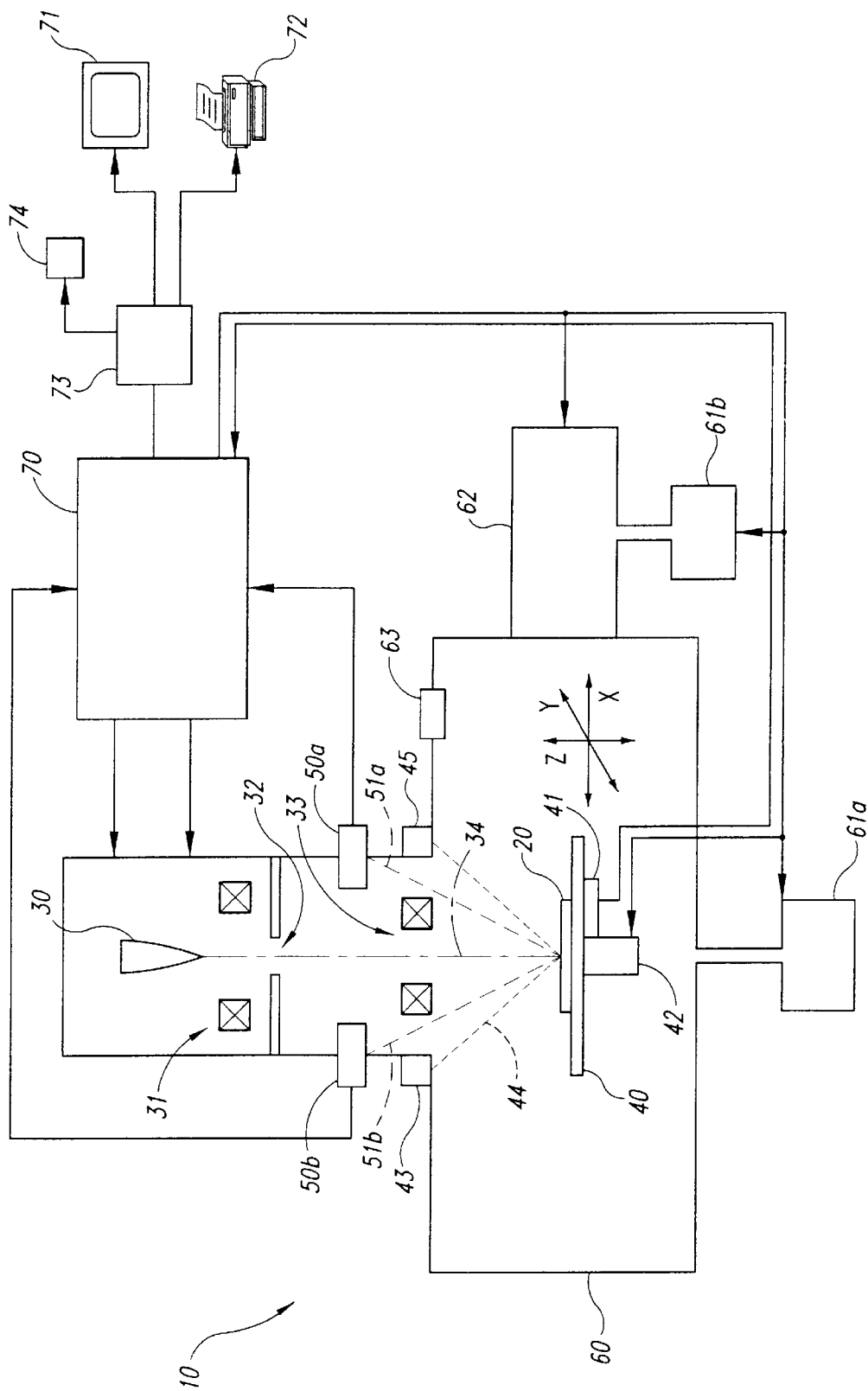
FIG. 1 is a schematic side elevation view of an apparatus in accordance with an embodiment of the invention supporting a semiconductor substrate.

FIG. 1 is a schematic side elevation view of an electron beam apparatus 10 in accordance with an embodiment of the invention. The apparatus 10 includes a vacuum chamber 60 in which is housed an electron gun 30. The electron gun 30 directs an electron beam 34 toward a semiconductor device or substrate 20 positioned on a support or stage 40 beneath the electron gun. The stage 40 moves relative to the electron beam 34 such that the electron beam scans across the semiconductor substrate 20. Electrons reflected or emitted by the semiconductor substrate 20 are received by two detectors 50 (shown as 50a and 50b). The detectors 50 transmit to a controller 70 and a processor 73 signals corresponding to the strength or intensity of the reflected beam. The data generated by the processor 73 are then analyzed to determine the dimensions of features on the semiconductor substrate 20.

The vacuum chamber 60 is coupled to two vacuum sources 61 (shown as 61a and 61b). One vacuum source 61a evacuates the main portion of the vacuum chamber 60 and the other vacuum source 61b evacuates a loading bay 62 connected to the vacuum chamber 60. Semiconductor substrates 20 may be loaded in the loading bay 62 while it is at atmospheric pressure and a vacuum is maintained in the vacuum chamber 60. The vacuum source 61b is then activated to lower the pressure in the loading bay 62 until it matches the vacuum pressure in the vacuum chamber 60, at which point the substrate 20 is moved into the vacuum chamber 60. Accordingly, the vacuum pressure in the vacuum chamber 60 may be maintained at less than atmospheric levels while the semiconductor substrate 20 is moved into and out of the vacuum chamber.

The semiconductor substrate 20 is transported from the loading bay 62 into the vacuum chamber 60 on the stage 40. A drive unit 42 is coupled to the stage 40 and moves the stage in three orthogonal directions, as indicated by arrows X, Y, and Z. The stage 40 includes a sensor 41 that tracks the location of the stage as it moves, and transmits to the controller 70 signals corresponding to the location of the stage. A light source 43 may be positioned above the stage 40 to separately measure the vertical position of the stage 40 by generating a light beam 44 that is reflected from the stage 40 and/or the semiconductor substrate 20 and received by a light detector 45. An optical microscope 63 may also be positioned above the stage 40 for visual inspection of the stage 40 and the semiconductor substrate 20.

The electron beam 34 emitted by the electron gun 30 passes through a condenser lens 31 that concentrates the electron beam 34, then through an aperture 32, and through an objective lens 33 that further concentrates the electron beam. The lenses 31 and 33 may include charged plates or other known means for focusing the electron beam 34. In one embodiment, the electron beam 34 strikes the semiconductor substrate 20 and is reflected in several directions. In another embodiment, the electron beam 34 strikes the semiconductor substrate 20 which in turn emits secondary electrons in several directions. The term secondary beam is used herein to refer to electron beams reflected by and/or emitted by the semiconductor substrate 20. For purposes of clarity, two secondary beams 51 (shown as 51a and 51b) are shown in FIG. 1, though it will be understood that the secondary electrons may form other beams that travel in directions other than those shown in FIG. 1.

In one embodiment, the two electron detectors 50 are positioned above the stage 40 to receive the two secondary beams 51. Other embodiments may include a greater or lesser number of electron detectors 50. In the embodiment shown in FIG. 1, the electron detectors 50 are positioned on opposite sides of the semiconductor substrate 20. Accordingly, a right electron detector 50a will tend to receive the right secondary beam 51a, which includes electrons emanating from rightward facing features, and the left electron detector 50b will tend to receive the left secondary beam 51b, which includes electrons emanating from leftward facing features, as will be discussed in greater detail below with respect to FIG. 2A.

When the secondary beams 51 strike the electron detectors 50, they generate electrical signals that are transmitted to the controller 70. The signals proceed from the controller 70 to the processor 73 where they are reduced to human readable representations, as will be discussed in greater detail below with reference to FIGS. 2B–2F. The representations may be displayed on a display 71 and/or may be printed on a printer 72, and/or may be stored on an electronic storage device 74 for subsequent processing.

The processor 70 is also coupled to the electron gun 30, the lenses 31 and 33, the vacuum sources 61, the loading bay 62, and the drive unit 42. Accordingly, the controller 70 may control the motion of the semiconductor substrate 20 into and out of the vacuum chamber 60 and the motion of the semiconductor substrate 20 and the electron beam 34 relative to each other.

In operation, the controller 70 controls the electron gun 30 and the lenses 31 and 33 to produce an electron beam 34 having a selected depth of focus. The drive unit 42 moves the stage 40 into position beneath the electron gun 30 and moves the stage in the Z direction so that the electron beam 34 is focused on a selected portion of the semiconductor substrate 20. The drive unit 42 then moves the stage 40 in the X and Y directions to scan the electron beam 34 in a series of parallel paths across the semiconductor substrate 20, producing the secondary beams 51 that are received by the electron detectors 50 and processed by the processor 73.

Figure 2A:
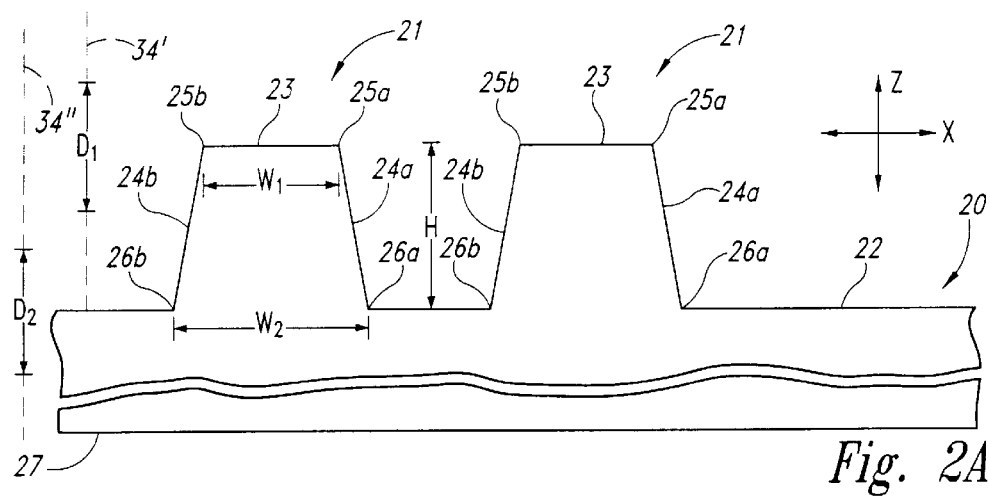
FIG. 2A is a detailed side elevation view of the semiconductor substrate of FIG. 1.

FIG. 2A is a side elevation view of an example of the semiconductor substrate 20. In the embodiment shown in FIG. 2A, the semiconductor substrate 20 has a top surface 22, a bottom surface 27, and two raised features 21 projecting above the top surface 22. In other embodiments, the semiconductor substrate 20 may have more than two features and/or may have features that are recessed from the top surface 22. Each feature 21 has an upper surface 23, upper corners 25 (shown as 25a and 25b), side surfaces 24 (shown as 24a and 24b), and lower corners 26 (shown as 26a and 26b).

Figure 2B:
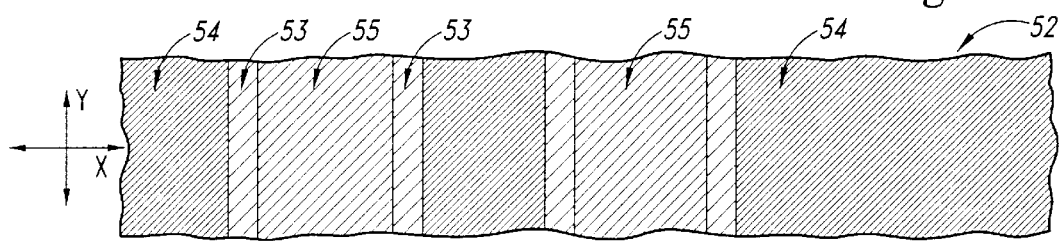
FIG. 2B is an image of a surface of the semiconductor substrate of FIG. 2A generated by the apparatus of FIG. 1.

The semiconductor substrate may be scanned by a first electron beam 34' having a depth of focus D, centered on the upper corners 25 of the features 21, and by a second electron beam 34" having a depth of focus $D_2$ centered on the lower corners 26 of the feature. When the first electron beam 34' scans across the semiconductor substrate 20, the detectors 50 (FIG. 1) generate a series of electrical signals corresponding to the secondary beams 51 (FIG. 1). FIG. 2B is a plan view of a two-dimensional image 52 generated from the signals and having a pattern of contrasting regions corresponding to the features 21 and the top surface 22 of the semiconductor substrate 20. As shown in FIG. 2B, dark regions 54 correspond to the substrate top surface 22, light regions 53 correspond to the side surfaces 24 of the features 21, and gray regions 55 correspond to the upper surfaces 23 of the features.

Figure 2C:
FIG. 2C is a graph of voltage as a function of distance obtained from the image of FIG. 2B and corresponding to signals detected by a first detector and generated by an electron beam having a first depth of focus.
Figure 2D:
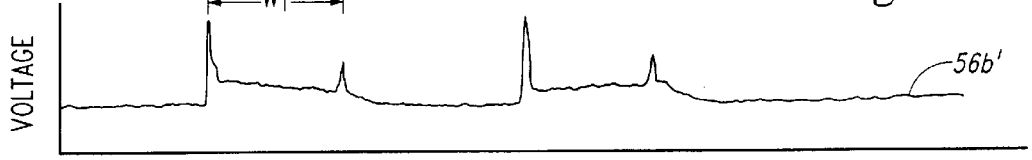
FIG. 2D is a graph of voltage as a function of distance obtained from the image of FIG. 2B and corresponding to signals detected by a second detector and generated by an electron beam having the first depth of focus.
Figure 2E:
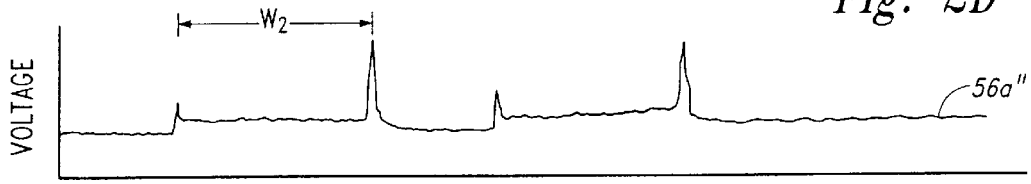
FIG. 2E is a graph of voltage as a function of distance obtained from the image of FIG. 2B and corresponding to signals detected by the first detector and generated by an electron beam having a second depth of focus.
Figure 2F:
FIG. 2F is a graph of voltage as a function of distance obtained from the image of FIG. 2B and corresponding to signals detected by the second detector and generated by an electron beam having the second depth of focus.

In one embodiment, the data for a given portion of the image 52 may be collapsed to produce a single graph of voltage (corresponding to the intensity of the secondary beam 51 (FIG. 1)) as a function of distance in the X direction. For example, FIG. 2C is a graph of a voltage signal 56a' as a function of distance in the X direction, as detected by the right electron detector 51a (FIG. 1). The signal 56a' has major spikes corresponding to the right upper corners 25a (facing toward the right detector 51a), and minor spikes corresponding to the left upper corners 25b (facing away from the right detector 51a). FIG. 2D is a similar graph of a voltage signal 56b' corresponding to the reflected intensity of the secondary beam 50b (FIG. 1) as detected by the left detector 51b (FIG. 1). A user may measure a width $W_1$ of the feature upper surface 23 by measuring the corresponding distance between the peaks shown in FIGS. 2C and/or 2D. In one embodiment, the user may use the voltage signal that most sharply defines the region of interest. For example, the user may use the voltage signal 56a' to accurately locate the right upper corners 25a and the voltage signal 56b' to accurately locate the left upper corners 25b.

In a manner similar to that discussed above with reference to FIGS. 2B–2D, the user may then generate another image (not shown) corresponding to electrons received from the semiconductor substrate 20 when it is impinged by the second electron beam 34". The data corresponding to the image may be collapsed to produce a voltage signal 56a" (shown in FIG. 2E) corresponding to the secondary beam 51a received by the right electron detector 50a, and a voltage signal 56b" (shown in FIG. 2F) corresponding to the secondary beam 51b received by the left electron detector 50b. A width $W_2$ of the base of feature 21 may be measured from the traces 56a" and 56b", in a manner similar to that discussed above with reference to FIGS. 2C–2D.

Figure 3A:
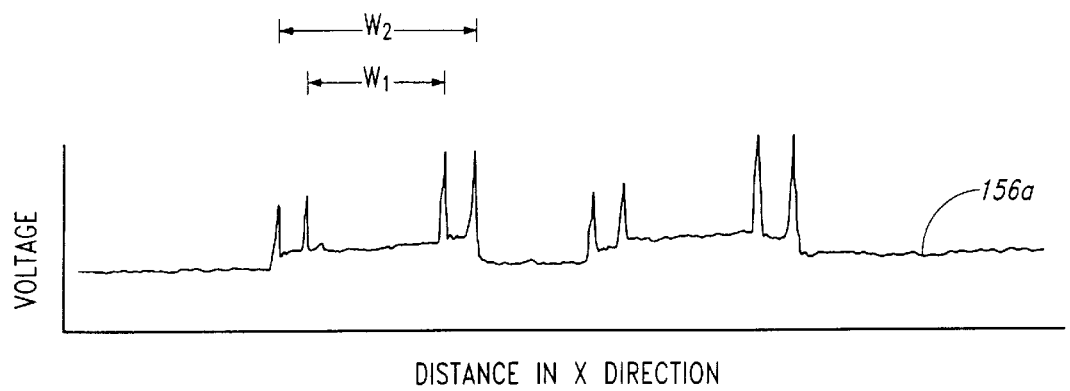
FIG. 3A is a graph of a combination of the voltages shown in FIGS. 2C and 2E.
Figure 3B:
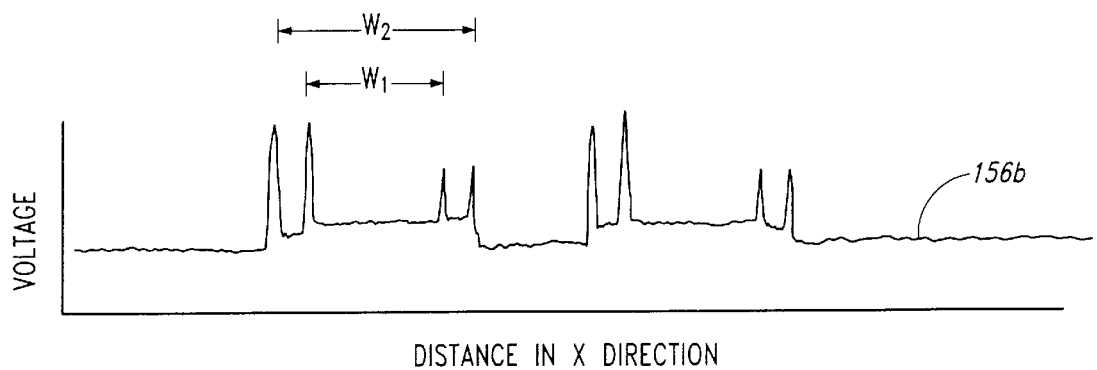
FIG. 3B is a graph of a combination of the voltages shown in FIGS. 2D and 2F.

In another aspect of this embodiment, the voltage signals 56a' and 56a" may be combined to form a single voltage signal 56a corresponding to the signal received by the right detector 50a (FIG. 1), as shown in FIG. 3A. Similarly, the voltage signals 56b' and 56b" may be combined to form a single trace 56b corresponding to the signal received by the left detector 50b (FIG. 1), as shown in FIG. 3B. The traces 56a and 56b may more clearly indicate the feature dimensions $W_1$ and $W_2$ in a single graph. In yet a further embodiment, the traces 56a and 56b may also be combined to form a single, composite signal.

Returning to FIG. 2A, other representations or combinations of representations may be used to determine the dimensions of the features 21 in other embodiments, so long as more than one electron beam is used to generate the representation. For example, in one such embodiment, a tabular representation of the voltage generated by the secondary beams 51 (FIG. 1) as a function of distance may be generated and analyzed to determine the dimensions of the features 21. In another embodiment, more than two electron beams 34, each having a different depth of focus, may be used to determine the width of a feature 21 at more than two distances from the top surface 22 of the semiconductor substrate 20. In still another embodiment, the user may analyze the data to determine dimensions other than the width of the feature 21. For example, in one such embodiment, the data may be used to determine a dimension of the feature 21 in the Y direction (FIG. 2B). In another such embodiment, the user may determine the height H of the feature 21 by taking the difference in distance in the Z direction between the focal points of the electron beams 34' and 34" and correlating the difference with corresponding known feature heights.

An advantage of the method and apparatus discussed above with reference to FIGS. 1–3B is that an electron beam 34 may be focused to have two different depths of focus corresponding to different heights of the feature 21 on the surface of the semiconductor substrate 20. Accordingly, the lateral dimensions of the feature 21 at each height may be determined, even if the dimensions are different at each height. Another advantage of the method and apparatus is that an electron beam 34 having a relatively small depth of focus may be used to resolve different portions of the feature in sharp focus by first scanning the feature with the electron beam focused at one depth and then scanning the same feature with the electron beam focused at a different depth. Yet a further advantage is that the height or depth of the feature may be determined by scanning the feature with an electron beam or beams 34 having different depths of focus.

Figure 4A:
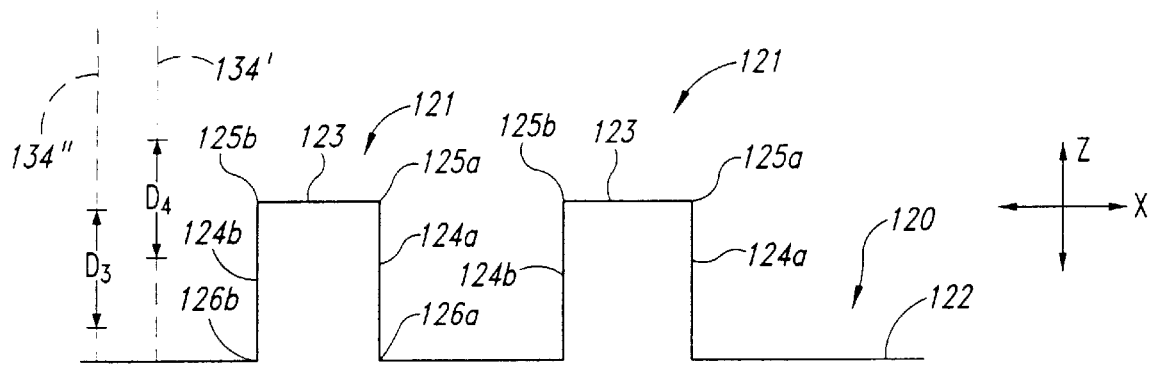
FIG. 4A is a side elevation view of another semiconductor substrate and two electron beams focused above a surface thereof.
Figure 4B:
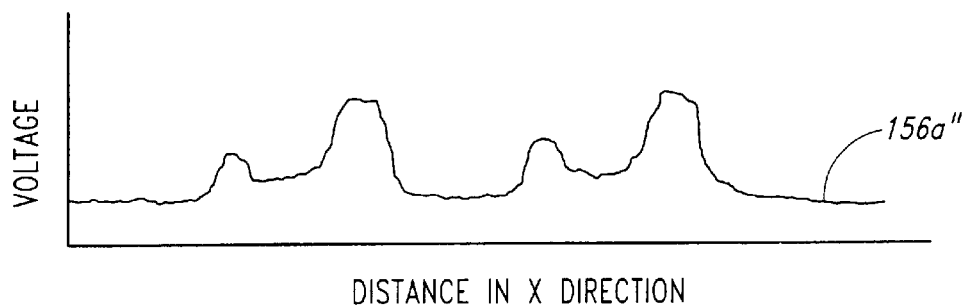
FIG. 4B is a graph of voltage as a function of distance corresponding to signals generated by an electron beam impinging on the semiconductor substrate of FIG. 4A and having a first depth of focus.

FIG. 4A is a side view of a semiconductor substrate 120 having a top surface 122 and raised features 121 with vertical side surfaces 124 (shown as 124a and 124b). An electron beam 134" having a depth of focus $D_3$ centered between the upper corners 125 (shown as 125a and 125b) and the lower corners 126 (shown as 126a and 126b) of the features 121 may be scanned over the semiconductor substrate 120. FIG. 4B is a graph of the resulting voltage signal 156a", as detected by the right detector 50a (FIG. 1). As shown in FIG. 4B, the voltage signal 156a" has relatively ill-defined peaks. When the focal point is shifted either upward or downward, the peaks may be more sharply defined. For example, the focal point may be shifted upward, such that an electron beam 134' has a depth of focus $D_4$ approximately centered at the upper corners 125a of the features 121. The resulting voltage signal 156a', shown in FIG. 4C, has more sharply defined peaks that more clearly indicate the corners 125 and 126 of the feature 121.

Figure 4C:
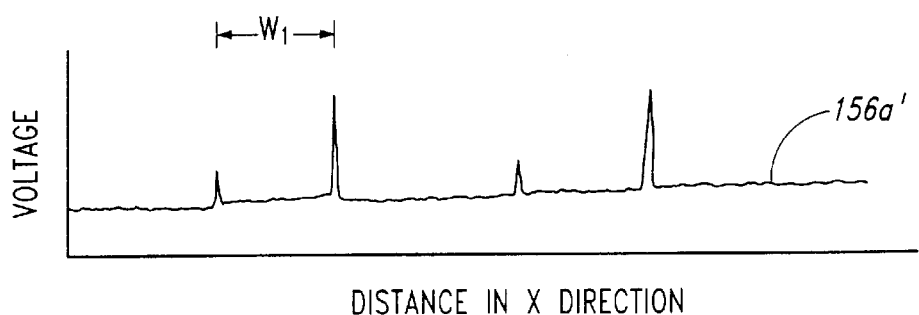
FIG. 4C is a graph of voltage as a function of distance corresponding to signals generated by an electron beam impinging on the semiconductor substrate of FIG. 4A and having a second depth of focus.

Referring to FIGS. 4A–4C, a method in accordance with one embodiment of the invention may include selecting a voltage signal that has a more sharply defined change in voltage as a function of distance, and measuring the width $W_1$ between peaks of the selected signal. In one aspect of this embodiment, where the width $W_1$ is the same at both the upper and lower corners 125 and 126, the selected signal may correspond to a depth of focus centered on either the upper corners 125 or the lower corners 126. The signal having the more sharply defined change in voltage as a function of distance may be selected manually by visually inspecting the traces 156a' and 156a" or automatically, for example with software that determines the slope and location of the spikes shown in FIGS. 4B–4C. Once the desired depth of focus has been established, any remaining unscanned portions of the semiconductor substrate 120, or other substrates, may be scanned with an electron beam having the same depth of focus.

An advantage of the method discussed above with reference to FIGS. 4A–4C when compared to the method discussed above with reference to FIGS. 2A–2F is that it may be less time-consuming to focus the electron beam sharply at a single location. This method may be particularly applicable where the feature has a constant width as a function of distance from the top surface 122 of the substrate 120. Conversely, an advantage of the method discussed above with reference to FIGS. 2A–2F is that by sharply focusing an electron beam on both the substrate top surface 122 and the feature upper surface 123, the dimensions of a feature may be readily determined, even if the feature has different widths as a function of distance from the top surface.

Figure 5:
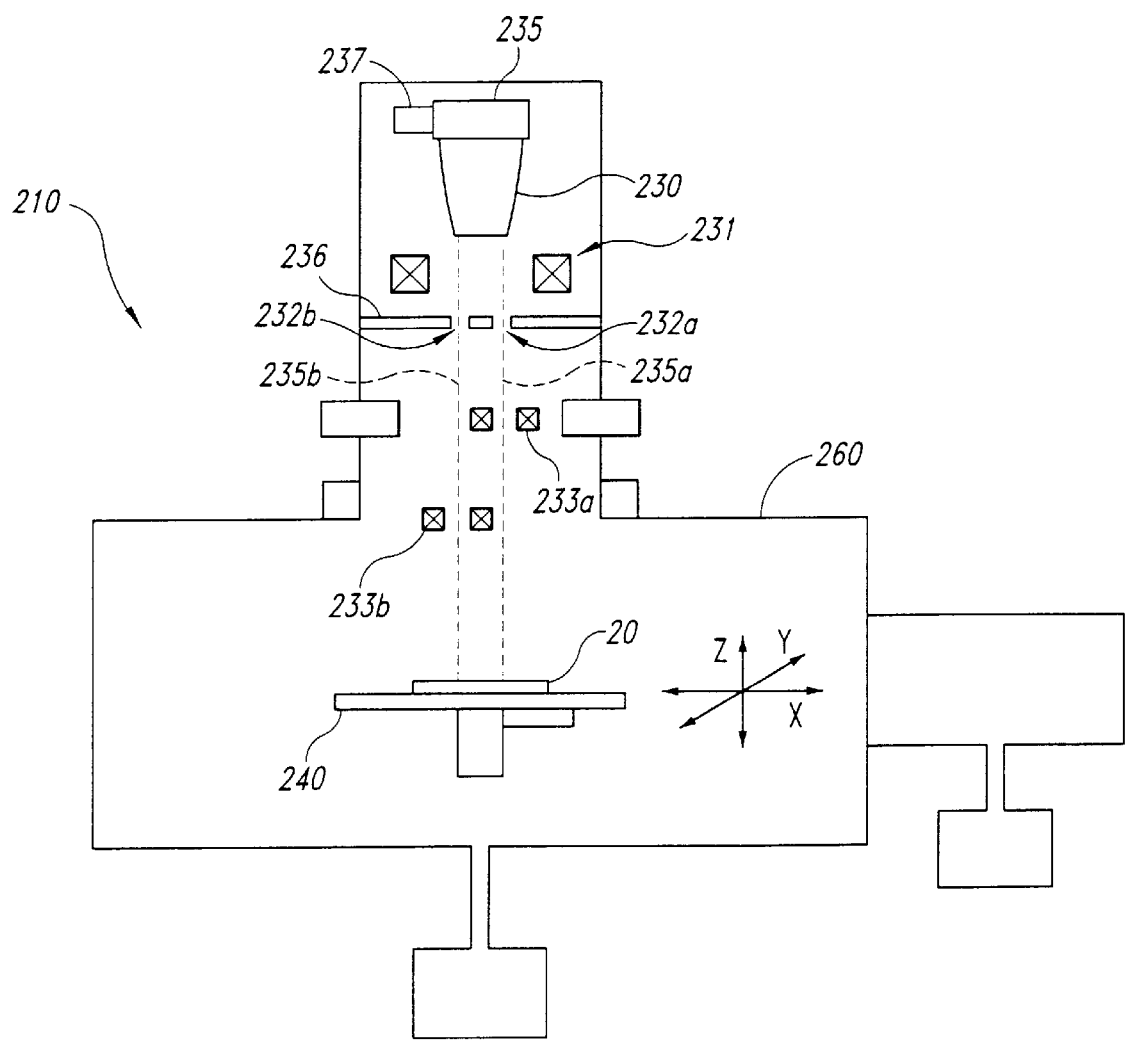
FIG. 5 is a schematic side elevation view of a portion of an apparatus having two ports in accordance with another embodiment of the invention.

FIG. 5 is a schematic side elevation view of an apparatus 210 in accordance with another embodiment of the invention. The apparatus 210 includes a vacuum chamber 260 having an electron gun 230 positioned above the stage 240 on which the substrate 20 is positioned. The electron gun 230 may be coupled to a drive unit 235 that moves the electron gun in the Z direction. A position detector 237 may be coupled to the electron gun 230 to track the movement of the electron gun. Electrons generated by the electron gun 230 pass through the condenser lens 231 and through two apertures or ports 232 (shown as 232a and 232b) in a port surface 236 to form two electron beams 235 (shown as 235a and 235b). The electron beams 235 are focused by corresponding objective lenses 233 (shown as 233a and 233b) before impinging on the semiconductor substrate 20.

In one aspect of this embodiment, the position of the substrate 20 relative to the focal points of the electron beams 235 may be changed by manipulating the lenses 231 and 233. In another aspect of this embodiment, the position of the semiconductor substrate 20 may be changed by moving the stage 240 relative to the electron gun 230. In yet another aspect of this embodiment, the relative position between the semiconductor substrate 20 and the focal points of the electron beams 235 may be changed by moving the electron gun 230 along the Z axis with the drive unit 235.

Each of the electron beams 235 may be focused at a different point along the Z axis. In one embodiment, the aperture 235b may be blocked and the semiconductor substrate 20 may be scanned by the one electron beam 235a. The aperture 235b may then be uncovered and the aperture 235a blocked and the semiconductor substrate 20 may be scanned with the other electron beam 235b. In another embodiment, the semiconductor substrate 20 may be scanned by both electron beams 235a and 235b simultaneously to produce a composite image and voltage signals similar to those shown in FIGS. 3A and 3B. Accordingly, one advantage of the apparatus 210 shown in FIG. 5 is that it may be less time-consuming to scan the semiconductor substrate 20 simultaneously with two electron beams, each having a different depth of focus. Conversely, an advantage of the device 10 shown in FIG. 1 is that for some semiconductor substrates 20, it may be more convenient to analyze separate images corresponding to electron beams having different depths of focus that it is to analyze the composite image and voltage signals data discussed above with reference to FIG. 5.

Figure 6:
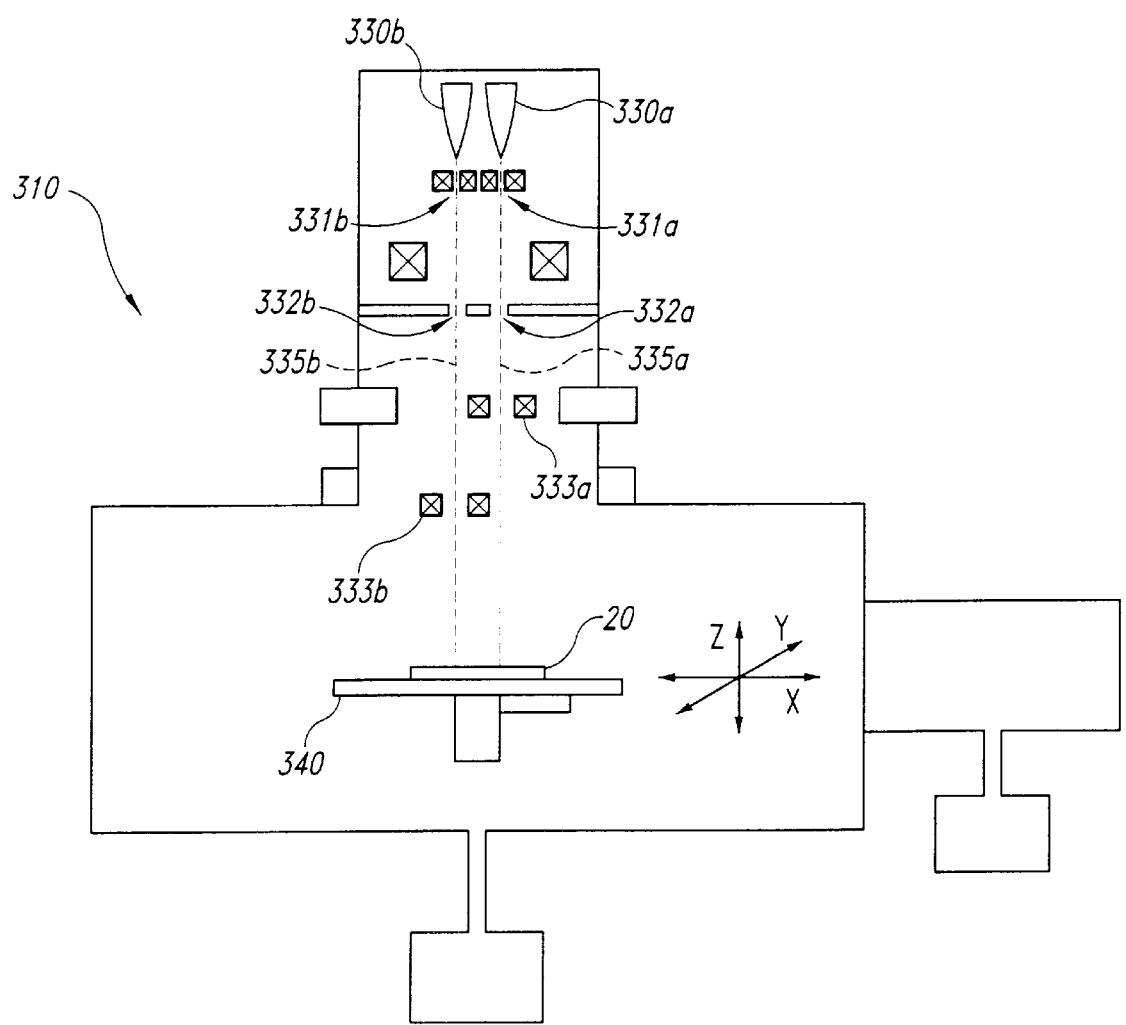
FIG. 6 is a side elevation schematic of a portion of an apparatus having two electron guns in accordance with still another embodiment of the invention.

FIG. 6 is a schematic side elevation view of an apparatus 310 in accordance with another embodiment of the invention having two electron guns 330 (shown as 330a and 330b) positioned above a stage 340 and the semiconductor substrate 20. The apparatus 310 further includes two corresponding condenser lenses 331 (shown as 331a and 331b), two apertures or ports 332 (shown as 332a and 332b), and two objective lenses 333 (shown as 333a and 333b) to focus the corresponding electron beams 335 (shown as 335a and 335b) on the semiconductor substrate 20. The apparatus 310 may be operated in a manner generally similar to that discussed above with reference to FIG. 5. One advantage of the apparatus 310 shown in FIG. 6, when compared to the apparatus 210 shown in FIG. 5, is that the electron beams 335a and 335b may be individually controlled because they are emitted from separate electron guns 330a and 330b, respectively. Conversely, an advantage of the apparatus 210 shown in FIG. 5 is that the single electron gun 230 may be less expensive to install and maintain than the dual electron guns 330a and 330b shown in FIG. 6.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for determining a dimension of a semiconductor device feature, comprising:

positioning a portion of the feature at a first axial distance from a focal point of an electron beam;

detecting a first flow of electrons corresponding to the electron beam and received from the feature when the electron beam impinges on the feature and the portion of the feature is spaced apart from the focal point by the first distance;

effectively moving at least one of the feature and the focal point of the electron beam to position the portion of the feature at a second axial distance from the focal point of the electron beam;

detecting a second flow of electrons corresponding to the electron beam and received from the feature when the electron beam impinges on the feature and the portion of the feature is spaced apart from the focal point by the second distance; and analyzing the first and second flows to determine a dimension of the feature.

2. The method of claim 1 wherein the first flow of electrons is a portion of the electron beam reflected by the feature and the step of detecting the first flow includes detecting the reflected portion of the electron beam.

3. The method of claim 1 wherein the first flow of electrons is emitted by the feature when the electron beam impinges thereon, and the step of detecting the first flow includes detecting the emitted electrons.

4. The method of claim 1 wherein the step of moving at least one of the feature and the focal point comprises moving the feature relative to the focal point along an axis of the electron beam.

5. The method of claim 1 wherein the step of moving at least one of the feature and the focal point includes moving a source of the electron beam relative to the feature along an axis of the electron beam.

6. The method of claim 1 wherein the step of moving at least one of the feature and the focal point comprises focusing the electron beam to have the focal point spaced apart from the feature by the second distance.

7. The method of claim 1, further comprising moving one of the feature and the electron beam transverse to an axis of the electron beam.

8. The method of claim 1, further comprising translating one of the feature and the electron beam along a first path transverse to an axis of the electron beam when the portion of the feature is spaced apart from the focal point by the first distance and translating one of the feature and the electron beam along a second path transverse to the axis of the electron beam when the portion of the feature is spaced apart from the focal point by the second distance.

9. The method of claim 8 wherein the first path is generally the same as the second path.

10. The method of claim 8 wherein the step of analyzing includes forming a first representation of a voltage corresponding to the first flow of electrons as a function of a first transverse distance translated by the one of the focal point and the feature along the first path, the step further including forming a second representation of a voltage corresponding to the second flow of electrons as a function of a second transverse distance translated by the one of the focal point and the feature along the second path, the step still further including selecting one of the first and second representations.

11. The method of claim 10 wherein the step of selecting includes visually accessing the first and second representations.

12. The method of claim 10 wherein the step of selecting includes using a computer program to select the one of the first and second representations.

13. The method of claim 10 wherein the step of forming the first representation includes forming a graphical representation.

14. The method of claim 10 wherein the step of forming the first representation includes forming a tabular representation.

15. The method of claim 10 wherein the first representation has a first change in voltage corresponding to an edge of the feature and the second representation has a second change in voltage corresponding to the edge of the feature and the step of analyzing the first and second flows includes selecting the one of the first and second representations having a greater change in voltage per unit of transverse distance.

16. The method of claim 15, further comprising scanning a remaining portion of the semiconductor device with the semiconductor device positioned at the one of the first and second axial distances that corresponds to the selected one of the first and second representations.

17. The method of claim 10, further comprising:

storing data corresponding to an intensity of the first flow of electrons as a function of a first transverse distance translated by the one of the focal point and the feature along the first path; and storing data corresponding to an intensity of the second flow of electrons as a function of a second transverse distance translated by the one of the focal point and the feature along the second path.

18. The method of claim 8 wherein the step of analyzing includes forming a first representation of a voltage corresponding to the first flow of electrons as a function of a first transverse distance translated by the one of the focal point and the feature along the first path, the step farther including forming a second representation of a voltage corresponding to the second flow of electrons as a function of a second transverse distance translated by the one of the focal point and the feature along the second path, the step still further including combining the first and second representations.

19. The method of claim 1 wherein the step of analyzing the first and second flows includes determining a lateral dimension of the feature.

20. The method of claim 1 wherein the step of an analyzing the first and second flows includes determining a vertical dimension of the feature.

21. The method of claim 20 wherein the step of moving at least one of the feature and the focal point includes measuring a first position of the focal point when the feature is spaced apart from the focal point by the first distance, focusing the electron beam to have the focal point spaced apart from the feature by the second distance, and measuring a second position of the focal point when the feature is spaced apart from the focal point by the second distance.

22. A method for measuring a dimension of a semiconductor device feature, comprising:

moving one of a first electron beam and the feature transversely relative to the other of the first electron beam and the feature, the first electron beam impinging on the feature and having a first depth of focus centered at a first point;

receiving a first flow of electrons from the feature corresponding to the first electron beam;

moving one of a second electron beam and the feature transversely relative to the other of the second electron beam and the feature, the second electron beam impinging on the feature and having a second depth of focus centered at a second point, the second depth of focus being different from the first depth of focus;

receiving a second flow of electrons from the feature corresponding to the second electron beam; and analyzing the first and second flows to determine a dimension of the feature.

23. The method of claim 22 wherein the first flow of electrons is a portion of the first electron beam reflected by the feature and the step of receiving the first flow includes receiving the reflected portion of the first electron beam.

24. The method of claim 22 wherein the first flow of electrons is emitted by the feature when the first electron beam impinges thereon, and the step of receiving the first flow includes receiving the emitted electrons.

25. The method of claim 22 wherein the step of analyzing includes forming a first representation of an intensity of the first flow of electrons as a function of a first transverse distance moved by the one of the first electron beam and the feature, the step further including forming a second representation of an intensity of the second flow of electrons as a function of a second transverse distance moved by the one of the second electron beam and the feature, the step still further including selecting one of the first and second representations.

26. The method of claim 25 wherein the step of forming a first representation of an intensity of the first flow of electrons includes forming a representation of a voltage corresponding to the first flow of the electrons.

27. The method of claim 25 wherein the first representation has a first change in intensity corresponding to an edge of the feature and the second representation has a second change in intensity corresponding to the edge of the feature and the step of analyzing the first and second flows includes selecting the one of the first and second representations having a greater change in intensity per unit of transverse distance moved.

28. The method of claim 25 wherein the step of analyzing includes forming a first representation of an intensity of the first flow of electrons as a function of a first transverse distance moved by the one of the first electron beam and the feature, the step further including forming a second representation of an intensity of the second flow of electrons as a function of a second transverse distance moved by the one of the second electron beam and the feature, the step still further including combining the first and second representations to form a composite representation.

29. The method of claim 25 wherein the step of moving one of the first electron beam and the feature is simultaneous with the act of moving one of the second electron beam and the feature.

30. The method of claim 25 wherein the step of moving one of the first electron beam and the feature occurs before the act of moving one of the second electron beam and the feature.

31. The method of claim 25, further comprising emitting the first and second electron beams sequentially from a single port.

32. The method of claim 25, further comprising emitting the first electron beam from a first port and simultaneously emitting the second electron beam from a second port.

33. The method of claim 25, further comprising emitting the first and second electron beams from a single electron gun.

34. The method of claim 25, further comprising emitting the first electron beam from a first electron gun and emitting the second electron beam from a second electron gun.

35. The method of claim 25, further comprising:
storing data corresponding to an intensity of the first flow of electrons as a function of a first transverse distance moved by the one of the first electron beam and the feature; and
storing data corresponding to an intensity of the second flow of electrons as a function of a second transverse distance moved by the one of the second electron beam and the feature.

36. The method of claim 25 wherein the step of analyzing the first and second flows includes determining a lateral dimension of the feature.

37. The method of claim 25 wherein the step of analyzing the first and second flows includes determining a vertical dimension of the feature.

38. The method of claim 37 wherein the step of determining the vertical dimension includes determining a distance between the first and second points, the first electron beam having the first depth of focus centered at the first point, the second electron beam having the second depth of focus centered at the second point.

39. A method for determining a width of a feature of a semiconductor device having a first surface and a second surface opposite the first surface, the feature having two first edges spaced apart from one of the first and second surfaces by a first distance and two second edges spaced apart from one of the first and second surfaces by a second distance, the method comprising:
focusing a first electron beam to have a first depth of focus approximately centered at the first distance and receiving a first flow of electrons from the feature corresponding to the first electron beam;
focusing a second electron beam to have a second depth of focus centered at a third distance different than the first and second distances and receiving a second flow of electrons from the feature corresponding to the second electron beam; and
measuring a distance between the first edges of the feature by moving one of the feature and the first electron beam relative to the other of the feature and the first electron beam transverse to an axis of the first electron beam along a transverse path while the first electron beam has a depth of focus approximately centered at the first distance.

40. The method of claim 39, further comprising emitting the first and second electron beams sequentially from a single source.

41. The method of claim 39, further comprising emitting the first electron beam from a first port and simultaneously emitting the second electron beam from a second port.

42. The method of claim 39 wherein the step of focusing the first electron beam is simultaneous with the step of focusing the second electron beam.

43. The method of claim 39 wherein the step of focusing the first electron beam occurs after the step of focusing the second electron beam.

44. The method of claim 39 wherein the step of measuring the distance between the first edges includes detecting an intensity of the first flow of electrons as a function of a transverse distance moved by the one of the first electron beam and the feature and determining a distance between changes in the intensity of the first flow.

45. The method of claim 39, further comprising storing data corresponding to the intensity of the first flow of electrons as a function of a transverse distance moved by the one of the first electron beam and the feature.

46. A method for determining a width of a feature of a semiconductor device having a first surface and a second surface opposite the first surface, the feature having first edges spaced apart from one of the first and second surfaces by a first distance and second edges spaced apart from one of the first and second surfaces by a second distance, the method comprising:
focusing a first electron beam to have a first depth of focus approximately centered at the first distance and receiving a first electron flow from the feature corresponding to the first electron beam;

focusing a second electron beam to have a second depth of focus approximately centered at the second distance and receiving a second electron flow from the feature corresponding to the second electron beam, the second distance being different from the first distance;

measuring the first electron flow to form a first measurement;

measuring the second electron flow to form a second measurement;

combining the first and second measurements to form a composite measurement; and analyzing the composite measurement to determine a width of the feature.

47. The method of claim 46, further comprising moving one of the feature and the first electron beam relative to the other transverse to an axis of the first electron beam along a first transverse path and moving one of the feature and the second electron beam relative to the other transverse to an axis of the second electron beam along a second transverse path.

48. The method of claim 47 wherein the composite measurement includes a voltage generated by the first electron flow as a function of a distance moved by the one of the first electron beam and the feature along the first transverse path, the composite measurement further including a voltage generated by the second electron flow as a function of a distance moved by the one of the second electron beam and the feature along the second transverse path, and the step of analyzing the composite measurement includes measuring a distance between changes in the voltage generated by one of the electron flows that correspond to the first edges.

49. The method of claim 48 wherein the step of analyzing the composite measurement includes measuring a first distance between changes in the voltage generated by the first electron flow that correspond to the first edges and measuring a second distance between changes in the voltage generated by the second electron that correspond to the second edges.

50. The method of claim 46 wherein the step of focusing the first electron beam is simultaneous with the step of focusing the second electron beam.

51. The method of claim 46 wherein the step of focusing the first electron beam occurs after the step of focusing the second electron beam.

52. The method of claim 46, further comprising emitting the first and second electron beams sequentially from a single port.

53. The method of claim 46, further comprising emitting the first electron beam from a first port and simultaneously emitting the second electron beam from a second port.

54. The method of claim 46 wherein the first electron flow is a portion of the first electron beam reflected by the feature and the step of measuring the first electron flow includes measuring the reflected portion of the first electron beam.

55. The method of claim 46 wherein the first electron flow is emitted by the feature when the first electron beam impinges thereon, and the step of measuring the first flow includes measuring the flow of emitted electrons.

* * * * *

UNITED STATES PATENT AND TRADEMARK OFFICE
CERTIFICATE OF CORRECTION

PATENT NO. : 6,124,140
DATED : September 26, 2000
INVENTOR(S) : Douglas D. Do and Jeff C. Johnson It is certified that error appears in the above-identified patent and that said Letters Patent is hereby corrected as shown below:

Column 10,
Line 25, "step farther including" should read -- step further including --
Line 34, "step of an analyzing" should read -- step of analyzing --

Column 11,
Line 49, "comprising emit ting" should read -- comprising emitting --

Signed and Sealed this

Twenty-first Day of August, 2001

Attest:

NICHOLAS P. GODICI
Attesting Officer — Acting Director of the United States Patent and Trademark Office